(12) United States Patent
Exler et al.

(10) Patent No.: US 9,081,310 B2
(45) Date of Patent: Jul. 14, 2015

(54) OPTICAL SYSTEM OF MICROLITHOGRAPHIC PROJECTION EXPOSURE APPARATUS AND METHOD OF CORRECTING WAVEFRONT DEFORMATION IN SAME

(75) Inventors: Matthias Exler, Aalen (DE); Ulrich Loering, Schwaebisch Gmuend (DE); Toralf Gruner, Aalen-Hofen (DE); Holger Walter, Abtsgmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 291 days.

(21) Appl. No.: 13/604,941

(22) Filed: Sep. 6, 2012

(65) Prior Publication Data
US 2013/0016331 A1 Jan. 17, 2013

Related U.S. Application Data

(63) Continuation of application No. PCT/EP2010/001900, filed on Mar. 26, 2010.

(51) Int. Cl.
| | |
|---|---|
| *G03B 27/54* | (2006.01) |
| *G03B 27/52* | (2006.01) |
| *G03F 7/20* | (2006.01) |

(52) U.S. Cl.
CPC ........ *G03F 7/70891* (2013.01); *G03F 7/70266* (2013.01); *G03F 7/70341* (2013.01)

(58) Field of Classification Search
CPC .. G03F 7/70891; G03F 7/702; G03F 7/70266
USPC .......... 355/30, 53, 67; 359/819–820
See application file for complete search history.

(56) References Cited

U.S. PATENT DOCUMENTS

| | | | | |
|---|---|---|---|---|
| 5,883,704 | A * | 3/1999 | Nishi et al. ............... | 355/67 |
| 5,920,377 | A * | 7/1999 | Kim ........................ | 355/30 |
| 5,995,263 | A | 11/1999 | Tokuda et al. | |
| 6,020,950 | A * | 2/2000 | Shiraishi .................. | 355/30 |
| 6,388,823 | B1 | 5/2002 | Gaber et al. | |
| 6,504,597 | B2 | 1/2003 | Schuster et al. | |
| 6,781,668 | B2 | 8/2004 | Schuster et al. | |
| 7,349,063 | B2 * | 3/2008 | Miyajima ................ | 355/30 |
| 7,760,323 | B2 * | 7/2010 | To et al. ................... | 355/30 |
| 2005/0018269 | A1 | 1/2005 | Weiss et al. | |
| 2008/0239503 | A1 | 10/2008 | Conradi et al. | |
| 2009/0257032 | A1 | 10/2009 | Eva et al. | |

FOREIGN PATENT DOCUMENTS

| | | |
|---|---|---|
| EP | 0 823 662 A2 | 2/1998 |
| EP | 1 524 558 | 4/2005 |
| JP | 10-214782 | 8/1998 |
| WO | WO 03/075096 | 9/2003 |
| WO | WO 2007/017089 | 2/2007 |
| WO | WO 2008/034636 | 3/2008 |

OTHER PUBLICATIONS

International Search Report for corresponding PCT Appl No. PCT/EP2010/001900, mailed Jan. 4, 2011.

* cited by examiner

*Primary Examiner* — Hung Henry Nguyen
(74) *Attorney, Agent, or Firm* — Fish & Richardson P.C.

(57) ABSTRACT

An optical system of a microlithographic projection exposure apparatus includes a wavefront correction device which has a plurality of fluid outlet apertures. The apertures are arranged so that fluid flows emerging from the outlet apertures enter a space through which projection light propagates during operation of the apparatus. A temperature controller sets the temperature of the fluid flows individually for each fluid flow. The temperature distribution is determined such that optical path length differences caused by the temperature distribution correct wavefront deformations.

28 Claims, 9 Drawing Sheets

OPTICAL SYSTEM OF MICROLITHOGRAPHIC PROJECTION EXPOSURE APPARATUS AND METHOD OF CORRECTING WAVEFRONT DEFORMATION IN SAME

CROSS-REFERENCE TO RELATED APPLICATIONS

This application is a continuation of, and claims benefit under 35 USC 120 to, international application PCT/EP2010/001900, filed Mar. 26, 2010. International application PCT/EP2010/001900 is hereby incorporated by reference in its entirety.

FIELD

The disclosure generally relates to an optical system of a microlithographic projection exposure apparatus, and more particularly to a projection objective including a wavefront correction device that is capable of correcting wavefront deformations. The disclosure also relates to a method of correcting a wavefront deformation in such a system.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. In general, at each layer of the fabrication, the wafer is first coated with a photoresist which is a material that is sensitive to radiation, such as ultraviolet light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask alignment stage for aligning the mask, a projection lens and a wafer alignment stage for aligning the wafer coated with the photoresist. The illumination system illuminates a field on the mask that may have the shape of a rectangular slit or a narrow ring segment, for example.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or simply scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification β of the projection lens, for which usually |β|<1 holds, for example |β|=1/4 or |β|=1/100.

One aim in the development of projection exposure apparatus is to be able to lithographically define structures with smaller and smaller dimensions on the wafer. Small structures lead to a high integration density, which generally has a favorable effect on the performance of the microstructured components produced with the aid of such apparatus.

The minimum size of the structures that can be lithographically defined is approximately proportional to the wavelength of the projection light. Therefore the manufacturers of such apparatus strive to use projection light having shorter and shorter wavelengths. Among the shortest wavelengths currently used are 248 nm, 193 nm or 157 nm and thus lie in the deep (DUV) or vacuum (VUV) ultraviolet spectral range. The next generation of commercially available apparatus will use projection light having an even shorter wavelength of about 13.5 nm (EUV). However, the optical systems of such EUV apparatus are catoptric, i.e. they contain only reflective optical elements, but no lenses.

The correction of image errors (aberrations) is becoming increasingly important for projection objectives designed for operating wavelengths in the DUV and VUV spectral range. Different types of image errors usually involve different correction measures.

The correction of rotationally symmetric image errors can be comparatively straightforward. An image error is referred to as being rotationally symmetric if the wavefront deformation in the exit pupil is rotationally symmetric. The term wavefront deformation refers to the deviation of a wave from the ideal aberration-free wave. Rotationally symmetric image errors can be corrected, for example, at least partially by moving individual optical elements along the optical axis.

Correction of those image errors which are not rotationally symmetric is typically more difficult. Such image errors occur, for example, because lenses and other optical elements heat up in a rotationally asymmetric manner. One image error of this type is astigmatism, which may also be observed for the field point lying on the optical axis.

A major cause for rotationally asymmetric heating of optical elements is a rotationally asymmetric, in particular slit-shaped and/or off-axis, illumination of the mask, as is typically encountered in projection exposure apparatus of the scanner type. The slit-shaped illuminated field causes a non-uniform heating of those optical elements that are arranged in the vicinity of field planes.

A non-uniform heating may also occur with certain illumination settings. The term illumination setting refers to the angular distribution of the projection light bundles that impinge on points on the mask. The illumination setting is often described by the intensity distribution in a pupil surface of the illumination system. For example, with a dipole illumination setting only two poles arranged symmetrically with regard to the optical axis are illuminated in the pupil surface of the illumination system. A similar intensity distribution including two high intensity poles will also be observed in a subsequent pupil surface within the projection objective. This results in a rotationally asymmetric heating of lenses which are arranged in or in close proximity to a pupil surface.

The non-uniform heating results in deformations of the optical elements and, in the case of lenses and other elements of the refractive type, in changes of their index of refraction. If the materials of refractive optical elements are repeatedly exposed to the high energetic projection light, also permanent material changes may occur. For example, sometimes a compaction of the materials exposed to the projection light is observed, and this compaction results in local and permanent changes of the index of refraction.

The heat induced deformations and/or index changes alter the optical properties of the optical elements and thus cause image errors. Heat induced image errors often have a twofold symmetry. However, image errors with other symmetries, for example threefold or fivefold, or image errors characterized by completely asymmetric wavefront deformations also occur in projection objectives. Completely asymmetric image errors are often caused by material defects which are statistically distributed over the optical elements contained in the projection objective.

In order to correct rotationally asymmetric image errors, U.S. Pat. No. 6,388,823 B1 proposes a lens which can be selectively deformed with the aid of a plurality of actuators distributed along the circumference of the lens. The deformation of the lens is determined such that heat induced image errors are at least partially corrected.

WO 2007/017089 A1 discloses a similar correction device. In this device one surface of a deformable plate contacts an index matched liquid. If the plate is deformed, the deformation of the surface adjacent the liquid has virtually no optical effect. Thus this device makes it possible to obtain correcting contributions from the deformation not of two, but of only one optical surface. A partial compensation of the correction effect as it is observed if two surfaces are deformed simultaneously is thus prevented.

However, the deformation of optical elements with the help of actuators can also have some drawbacks. If the actuators are arranged at the circumference of a plate or a lens, it may be possible to produce only a restricted variety of deformations with the help of the actuators. This is due to the fact that both the number and also the arrangement of the actuators are fixed.

The aforementioned WO 2007/017089 A1 also proposes to apply transparent actuators directly on the optical surface of an optical element. However, it can be difficult to keep scattering losses produced by the transparent actuators low.

US 2009/0257032 A1 discloses a wavefront correction device which includes an optical element and a plurality of very thin electrical conductor stripes that are applied to a surface of the optical element or are integrated therein. In one embodiment arrays of conductor stripes are stacked one above the other, and a mechanism is proposed to restrict the heat dissipation to the crossing areas of the conductor stripes. This wavefront correction device makes it possible to produce a wide variety of temperature distributions within the optical element, and consequently a wide variety of rotationally asymmetric wavefront deformations can be corrected. However, light losses due to scattering can remain an issue.

An entirely different approach to deal with heat induced image errors is not to correct the errors, but to avoid that the errors occur altogether. This usually involves the locally selective heating or cooling of optical elements so that their temperature distribution becomes at least substantially symmetrical. Any residual heat induced image error of the rotationally symmetric type may then be corrected by more straightforward measures, for example by displacing optical elements along the optical axis.

The additional heating or cooling of optical elements may be accomplished by directing a heated or cooled gas towards the element, as it is known from U.S. Pat. No. 6,781,668 B2, for example. Similar cooling devices which direct cooled gas flows towards an optical element are also known from U.S. Pat. No. 5,995,263 and JP 10214782 A. In all these prior art devices all gas flows have the same temperature which can be adjusted with the help of a tempering device that cools the gas to a predetermined temperature. Control of the cooling effect appears to be exclusively achieved by changing the flow rate of the gas.

It has also been proposed to direct light beams onto selected portions of optical elements so as to achieve an at least substantially rotationally symmetric temperature distribution on or in the optical element. Usually the light beam is produced by a separate light source which emits radiation having a wavelength that is different from the wavelength of the projection light. This wavelength is determined such that the correction light does not contribute to the exposure of the photoresist, but is still at least partially absorbed by the optical elements or a layer applied thereon.

EP 823 662 A2 describes a correction system of this type. In one embodiment additional correction light is coupled into the illumination system of the projection exposure apparatus in or in close proximity to a pupil surface.

US 2005/0018269 A1 describes a correction device which makes it possible to heat up certain portions of selected optical elements using a light ray that scans over the portions to be heated up.

U.S. Pat. No. 6,504,597 B2 proposes a correction device which does not employ scanning light rays. Instead, correction light is coupled into selected optical elements via their peripheral surface, i.e. circumferentially.

SUMMARY

The disclosure provides an optical system of a microlithographic projection exposure apparatus including a wavefront correction device which is capable of correcting a wide variety of different rotationally asymmetric wavefront deformations. The device need not use actuators or electric heating wires which are exposed to the projection light and which therefore may form sources of scattering light.

The disclosure also provides a method of correcting a wavefront deformation in an optical system of a microlithographic projection exposure apparatus.

In one aspect, an optical system includes a wavefront correction device which includes a plurality of fluid outlet apertures. The outlet apertures are arranged such that fluid flows emerging from the outlet apertures enter a space through which projection light propagates during operating of the apparatus. The wavefront correction device further includes a temperature controller which is capable of setting the temperature of the fluid flows individually for each fluid flow.

Unlike correction devices in which gas flows are used to cool or heat optical elements, the fluid flows of the present disclosure form, in their entirety, an optical "element" which corrects wavefront deformations. Since the refractive index of the fluid flows depends on their temperature which can be set individually by the temperature controller, it is possible to produce a certain refractive index distribution in this "element". This refractive index distribution is determined such that a deformed wavefront passing through the "element" will be modified such that the deformation is at least substantially reduced. The entirety of fluid flows thus forms a kind of (aspheric) graded index lens whose properties can be varied by individually changing the temperatures of the fluid flows.

On the other hand, unlike the approach disclosed in US 2009/0257032 A1, in the present disclosure the wavefront correction device can be used without heating wires (which can scatter the projection light to some extent).

The optical path length difference $\Delta OPL$ produced by a fluid flow having a homogenous temperature is given by $$\Delta OPL = dn/dt \cdot \Delta T \cdot d,$$

if the fluid changes its temperature from $T_0$ to $T_0 + \Delta T$, wherein d is the thickness of the fluid flow, through which the light propagates, and dn/dt is the temperature dependence of the refractive index of the fluid. The larger dn/dT is, the smaller will be the temperature change $\Delta T$ that is used to produce a desired optical path length difference $\Delta OPL$.

The fluid which emerges from the outlet apertures may be a gas such as air, nitrogen or helium. In one embodiment this gas is the same gas which surrounds the optical elements of the optical system. At a wavelength of 193 nm the temperature dependence of the refractive index dn/dt of air is approximately $-1.05 \cdot 10^{-6}$ K$^{-1}$. If it is desired to achieve a wavefront deformation of 50 nm, this will involve a temperature change $\Delta T$ of about 4.8 K if the thickness d of the air flow is assumed to be 10 mm.

However, the fluid emerging from the outlet apertures may also be a liquid transparent to the projection light. Pure water, which is a preferred liquid in this context because of its high transmissivity for DUV and VUV light, has a temperature dependence of the refractive index dn/dt of about $-10^{-4}$ K$^{-1}$ so that the same wavefront deformation of 50 nm involves only a temperature difference $\Delta T$ of 0.5 K and a thickness d of the fluid flow of 1 mm.

Unlike gas flows, liquid flows involve some kind of support structure on their way across the space through which the projection light propagates. To this end at least one transparent optical element, in particular a plane-parallel plate, may be arranged horizontally or slightly inclined in the space as a support structure, and also vertically extending walls will usually be used to prevent the entirety of liquid flows from flowing away laterally.

According to the present disclosure the fluid outlet apertures are preferably designed and arranged so that the individual fluid flows are at least substantially laminar flows, at least within the space through which the projection light propagates. The laminarity ensures that the fluid flows have homogeneous optical properties. Turbulences will cause density fluctuations which result in undesirable fluctuations of the refractive index. Furthermore—particularly if parallel fluid flows are in immediate contact—the laminarity helps to prevent an undesired heat exchange to an adjacent fluid flow or an adjacent other medium by convection.

Preferably the Reynolds number which is associated with the fluid flows is below 10000 (which also includes a flow in the transition region from laminarity to turbulence), and more preferably below 6000, and still more preferably below 3000.

In order to achieve an at least substantial laminar fluid flow, it may be advantageous to arrange the outlet apertures such that the fluid flows do not intersect each other. Usually it is difficult to maintain the laminarity if the directions of adjacent fluid flows differ by more than a few degrees.

Furthermore, the outlet apertures may be arranged such that the fluid flows emerge from the outlet apertures at least substantially perpendicularly to an optical axis of the optical system. The fluid flows then extend in planes that are perpendicular to the optical axis, and this results in a certain degree of symmetry which is advantageous when correcting the deformations of a wavefront propagating along the optical axis.

In order to maintain the laminarity of the fluid flows, the outlet apertures may be arranged with respect to optical elements contained in the optical system such that the fluid flows do not impinge on any of the optical elements. However, if the fluid flows impinge on an optical surface at a very small angle, the laminarity may still be preserved. In other embodiments, therefore, the outlet apertures are arranged with respect to the optical elements such that at least some fluid flows impinge on a surface of one of the optical elements, thereby producing a laminar fluid flow on the surface.

The optical system may be a projection objective of the microlithographic projection exposure apparatus. The projection objective images a mask arranged in an object plane onto a light sensitive surface arranged in an image plane of the objective. The projection objective may be dioptric, i.e. containing only refractive optical elements, or catadioptric, i.e. containing refractive as well as reflective optical elements (mirrors). However, the optical system may also be an objective which is contained in an illumination system of the apparatus and images a field stop on the mask.

The wavefront correction device may be arranged in a pupil surface of the optical system. Such an arrangement is often preferred because the wavefront correction device then has a field-independent effect, i.e. the same effect on the wavefronts is achieved irrespective of the field position from which the wave originates. Such a field-independent effect is often desired in projection objectives of projection exposure apparatus. Further details with regard to suitable positions of wavefront correction devices can be gleaned from WO 2008/034636 A2.

In another embodiment the temperature controller is configured to set the temperatures of the fluid flows so that the fluid flows taken as a whole do not affect the heat balance of the optical system. In other words, if the ambient temperature within the projection objective has a certain value, some fluid flows should have a higher temperature and some fluid flows a lower temperature than this ambient temperature so that, taken as a whole, the temperature within the optical system does not change at all. This can avoid negative effects on other optical elements contained in the optical system which may occur if the ambient temperature changes when the wavefront correction device is operated.

In another embodiment the wavefront correction device includes a suction unit which is configured to suck off the fluid after it has traversed the space through which the projection light propagates. Such a unit produces a negative pressure with regard to the ambient pressure and may thus be helpful to maintain the laminarity over a longer distance.

The wavefront correction device may include a fluid supply unit and a plurality of channels which are connected at one end with the fluid supply unit and which terminate at the other end at the outlet apertures. The channels may be straight or curved, and at least some of them may extend in parallel so that also the fluid flows emerging from the outlet apertures are arranged in parallel.

The temperature control unit may include heat dissipating members that are arranged at the inside or the outside of channel walls defining the channels. The heat dissipating members may be formed by electrical resistance stripes or wires, for example. This facilitates an easy control of the temperature of the fluid which flows through the channels along the heat dissipating members and finally emerges from the outlet apertures.

At least one channel may have a cross section which has the shape of a rectangle or a closed curve. In particular, the cross section may have the shape of a square, an oval, an ellipse or a circle.

It is also possible to provide channels having different cross sections so that also the fluid flows emerging from the outlet apertures have a different cross section and/or a different flow velocity.

At least one channel may have a cross section that varies along the length of the channels. For example, if the cross section diminishes towards the outlet aperture, this may be helpful to produce a laminar fluid flow.

In order to be able to produce a wide variety of different temperature distributions in the space through which the projection light propagates, the outlet apertures may be arranged such that at least two fluid flows are non-parallel, but do not intersect each other. In other words, the fluid flows are arranged skew-whiff which involves that non-parallel fluid flows do not extend in the same plane.

In another embodiment the outlet apertures are arranged in planes that are spaced apart along an optical axis of the optical system. This makes it possible to produce a three dimensional temperature distribution which can, due to its impact on the refractive index of the fluid, correct a wide variety of different wavefront deformations.

The fluid flows may then have directions that are different for each plane. For example, there may be only two directions which are orthogonal, or there may be four directions which are separated by angles of 30°, respectively.

If the microlithographic projection exposure apparatus includes a wavefront deformation detection system which is configured to detect a wavefront deformation and is connected to the temperature controller, the latter may be configured to control the temperature of the fluid flows depending on the wavefront deformation detected by the wavefront deformation detection system.

In another embodiment the wavefront correction device can be displaced along the optical axis of the optical system so that the axial position of the fluid flows in the diverging projection light is changed. This may be used for a kind of fine tuning of the correction effect.

The wavefront correction device may advantageously be used together with other types of correction devices, for example with manipulators that displace optical elements along the optical axis or bend optical elements, with devices that change the wavelength of the projection light or the composition, pressure or temperature of an ambient gas. Then these other manipulators and devices may be used to achieve a coarse correction, and a fine correction of residual wavefront deformations is achieved by the wavefront correction device in accordance with the present disclosure.

For calibrating the wavefront correction device the temperature controller may subsequently change the temperature of the fluid flows one by one so that only one fluid flow has a temperature which differs from the temperature of the other fluid flows which are preferably equal to the temperature of an ambient gas. Then the effect on an optical wavefront is measured, for example with the help of an interferometer, as it is known in the art as such.

The disclosure provides a method which includes guiding a plurality of fluid flows through a space through which projection light propagates during operation of the apparatus, and individually controlling the temperatures of the fluid flows so the wavefront deformation is reduced.

The wavefront deformation is preferably determined by a wavefront deformation detection system, by simulation or by using a look-up table which contains information relating to the wavefront deformations depending on certain operating conditions such as the duration of projection operation or illumination settings.

The above remarks relating to the optical system generally apply here as well.

BRIEF DESCRIPTION OF THE DRAWINGS

Various features and advantages of the present disclosure may be more readily understood with reference to the following detailed description taken in conjunction with the accompanying drawing in which.

DESCRIPTION OF PREFERRED EMBODIMENTS

I. First Embodiment

1. General Design of Projection Exposure Apparatus

Figure 1:
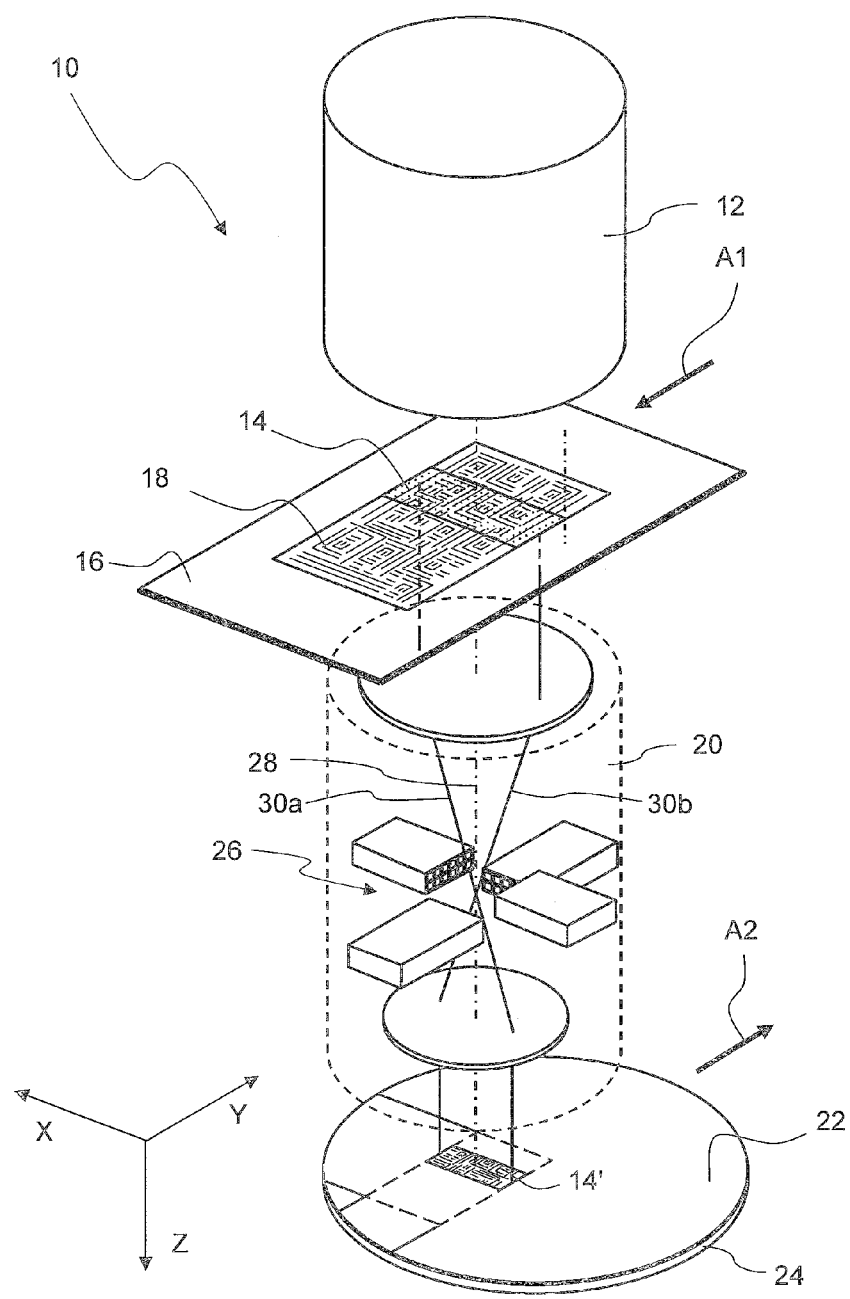
FIG. 1 is a perspective simplified view of a projection exposure apparatus in accordance with the present disclosure.

FIG. 1 is a perspective and highly simplified view of a projection exposure apparatus 10 including an illumination system 12 which produces a projection light beam. The latter illuminates a field 14 on a mask 16 containing minute structures 18. In this embodiment the illuminated field 14 has the shape of a rectangle. However, other shapes of the illuminated field 14, for example ring segments, are contemplated as well.

A projection objective 20 images the structures 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. The objective has a magnification β with |β|<1, and a reduced image 14' of the structures 18 within the illuminated field 14 is projected onto the light sensitive layer 22.

During the projection the mask 16 and the substrate 24 move (anti-)parallel to a scan direction which coincides with the Y direction. The illuminated field 14 then scans over the mask 16 so that structured areas larger than the illuminated field 14 can be continuously projected. Such a type of projection exposure apparatus is often referred to as "step-and-scan tool" or simply a "scanner". The ratio between the velocity of the substrate 24 to the mask 16 is equal to the magnification β of the projection objective 20. If the projection objective 20 inverts the image (β<0), the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

In the embodiment shown, the illuminated field 14 is centered with respect to an optical axis 26 of the projection objective 20. This is usually the case in dioptric projection objectives, i.e. objectives containing only refractive optical elements (no mirrors). Examples for this type of projection objective can be found in WO 2003/075096 A2. In other embodiments, the illuminated field 14 is not centered with respect to the optical axis 26. An off-axis object and image field may be used with certain types of catadioptric projection objectives 20, i.e. objectives that contain refractive as well as reflective optical elements. Examples for catadioptric projection objectives having off-axis object and image fields can be found in U.S. Pat. No. 6,665,126 B2 and WO 2005/069055 A2. The present disclosure can be advantageously used in any of the projection objectives described in the aforementioned documents.

The projection objective 20 accommodates a wavefront correction device 26 for reducing image errors. The causes for the image errors to be corrected may be constant or time dependent. Constant causes include design deficiencies, impurities or other faults in lens materials or anti-reflection coatings, and mounting tolerances. Time dependent causes include variable ambient conditions such as air pressure and temperature, certain ageing phenomena such as material compaction caused by the high energy projection light, and deformations and refractive index changes induced by temperature changes that are caused by the absorption of projection light within lens materials.

Image errors are often described with respect to wavefront deformations. In this context the wavefront of the light waves converging to a particular point in the image plane are considered and compared with an ideal wavefront. The deformations observed may be rotationally symmetrical or rotationally asymmetrical. Apart from that, the wavefront deformations may be identical for all points in the image field, or may be different for some or each of these points. Generally, the wavefront correction device 26 of the present disclosure may be arranged and configured such that any of the aforementioned wavefront deformations can be substantially reduced.

In the embodiment shown in FIG. 1 the wavefront correction device 26 is arranged and configured such that only those image errors are corrected that are at least substantially field independent. This means that the wavefront deformations are identical for all points in the image plane. To this end the wavefront correction device 26 is positioned in or in close proximity to a pupil surface of the projection objective 20. The pupil surface of the projection objective 20, which is often approximately planar and therefore referred to as pupil plane, is characterized by the property that the principal rays of the projection objective 20 cross its optical axis 28 where the pupil surface intersects the optical axis 28. In FIG. 1 this is illustrated for two principal rays 30a, 30b.

2. Wavefront Correction Device

Figure 2:
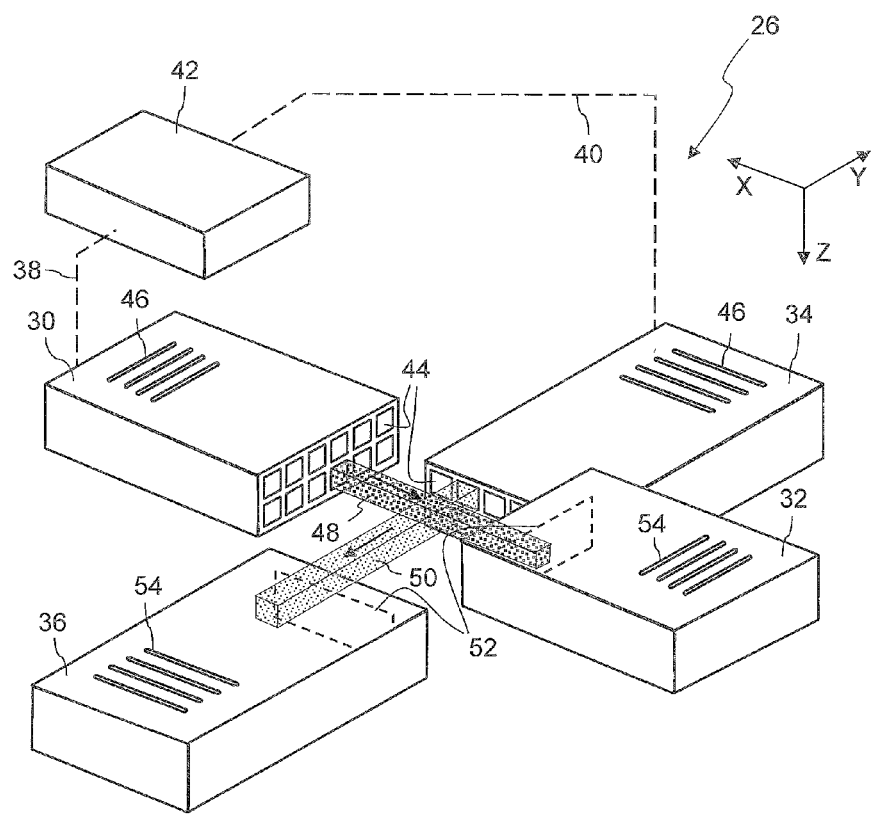
FIG. 2 is a schematic perspective view of the wavefront correction device according to a first embodiment.

FIG. 2 is a simplified perspective view of the wavefront correction device 26 shown in FIG. 1. The wavefront correction device 26 includes a first outlet unit 30, a first suction unit 32 which is associated with the first outlet unit 30, a second outlet unit 34 and a second suction unit 36 which is associated with the second outlet unit 34. The first and second outlets units 30, 34 are connected via signal lines 38 and 40, respectively, to a control unit 42.

The first and second outlet units 30, 34 each include a plurality of fluid outlet apertures 44 that are arranged in a regular pattern on front faces of the outlet units 30, 34. In this embodiment the pattern includes two rows of apertures 44 each extending in an XY plane and stacked one above the other along the Z direction. The first and second outlet units 30, 34 suck in a gas surrounding the lenses of the objective 20, for example air or nitrogen, through inlet slits 46 and expel the gas via the outlet apertures 44 as laminar gas flows. In FIG. 2 only one such gas flow 48, 50 is illustrated for the first and second outlet units 30 and 34, respectively. The gas flows 48, 50 emerging from the outlet apertures 44 enter a space that is surrounded by the units 30, 32, 34, 36 and through which projection light propagates during operation of the apparatus 10, as can be seen in FIG. 1. After the gas flows have traversed the space through which projection light propagates during operation of the apparatus 10, they enter the first and second suction units 32, 36 through larger suction apertures 52 which are indicated in FIG. 2 by broken lines. The suction units 32, 36 maintain a small negative pressure so that the gas flows 48, 50 are sucked in by the suction units 32, 36. The sucked in gas is released, after an optional heating or cooling process, via outlet slits 54 provided at the suction units 32, 36.

Each one of the outlet unit 30, 34 includes a temperature controller which is capable of setting the temperature of the gas flows individually for each gas flow. In FIG. 2 this is illustrated by different graphic illustrations of the gas flows 48, 50.

In FIG. 2 it can also be seen that the first outlet unit 30 and the associated first suction unit 32 on the one hand and the second outlet unit 34 and the associated second suction unit 36 on the other hand are arranged in different planes along the Z direction which is parallel to the optical axis 28 of the objective 20. Therefore the gas flows 48 emerging from the first outlet unit 30 and the gas flows 50 emerging from the second outlet unit 34 do not intersect each other, but propagate through the space in different planes. This ensures that the gas flows 48, 50 can pass through the space without losing their laminarity.

Figures 3, 4:
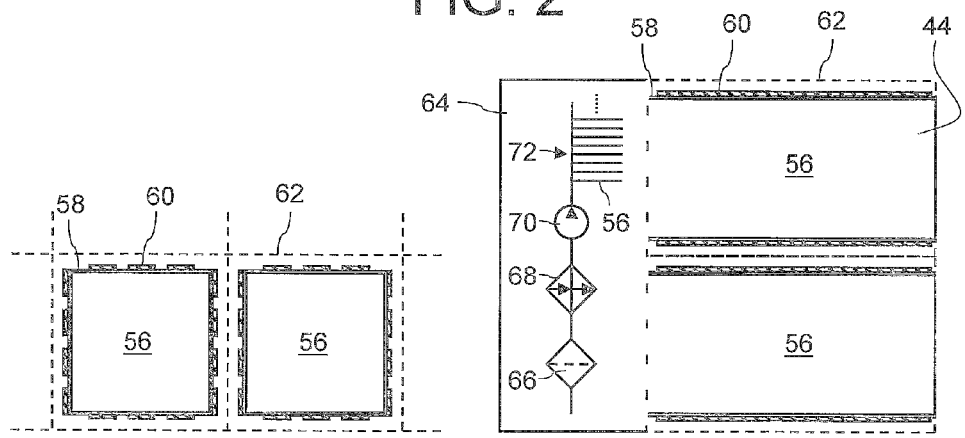
FIG. 3 is a partial cross section through a first outlet unit of the wavefront correction device showing the cross sections of channels.
FIG. 4 is a partial longitudinal section through the first outlet unit.

As is illustrated in the simplified sections of FIGS. 3 and 4 through a portion of the outlet units 30, 34, the outlet apertures 44 are formed by open ends of channels 56 that are accommodated in the outlet units 30, 34. In this embodiment the channels 56 have a square cross section and are defined by thin channel walls 58. The inner surfaces of the channel walls 58 are configured such that gas can flow through the channels 56 without losing, or even thereby achieving, its laminarity.

On the outer surface of the channel walls 58 resistive heating stripes 60 are attached that make it possible to vary, for example by changing the electrical voltage applied to the stripes 60 or (in the case of a pulsed current) by changing the pulse period, the temperature of the gas flowing through the channels 56. The resistive heating stripes 60 are connected to a power supply board (not shown) which, in turn, is controlled by the control unit 42. The control unit 42 determines the temperature which the gas flowing through the channel 56 shall have, and the power supply board sets the electrical quantities such as voltage or pulse duration such that the resistive heating stripes 60 will dissipate heat to achieve the gas temperature that has been determined by the control unit 42. An open or closed loop control may be provided for setting the temperature of the gas flows 48 to the desired value. The resistive heating stripes 60 and the power supply board commonly form the temperature controller which sets the temperature of the gas flows individually.

The channel walls 58 with the resistive heating stripes 60 applied thereon are received in a support structure 62 which is indicated in FIGS. 3 and 4 only schematically by dashed lines.

As can be seen in FIG. 4, each channel 56 is connected at one end to a fluid supply unit 64 and terminates at the other end at the outlet aperture 44. The fluid supply unit 64 includes a filter 66, a temperature pre-controller 68 and a pump 70 which pumps the gas via branchings 72 into the channels 56. There the temperature of the gas is finally adjusted to the desired values with the help of the resistive heating stripes 60.

3. Function

In the following the function of the wavefront correction device 26 will be described with reference to FIGS. 5 to 8.

Figure 5:
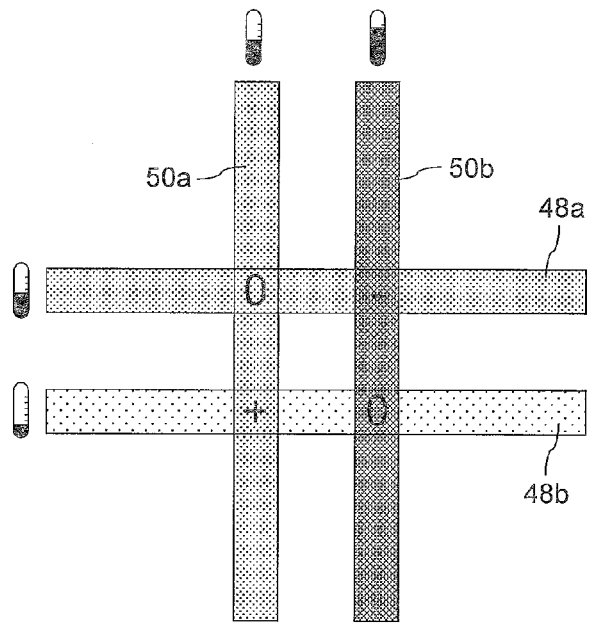
FIG. 5 is a schematic representation of four gas flows arranged in two different planes.

FIG. 5 illustrates two exemplary gas flows 48a, 48b emerging from the first outlet unit 30 and two further exemplary gas flows 50a, 50b emerging from the second outlet unit 34. Here it is assumed that the gas flows 48a and 50a have the same temperature which is equal to the temperature of an ambient gas in the projection objective 20 (usually 22° C.). Since there is no temperature difference to the temperature of the ambient gas, these fluid flows are indicated with a zero.

The gas flow 48b, however, has a lower temperature than the ambient gas, as it is indicated by symbol representing a thermometer. In contrast, the other gas flow 50b has a higher temperature than the ambient gas.

In the following it will be explained what happens to light that passes parallel to the optical axis 28 of the projection objective 20 through the four positions where, in a projection along the optical axis 28, the four gas flows 48a, 48b, 50a and 50b seem to intersect each other. In this context it should be recalled that the gas flows do not really intersect each other, but cross each other in different planes along the Z axis so that their laminarity is not disturbed. However, for the sake of simplicity, a position in an XY plane will nevertheless be referred to in the following as "where (certain) gas flows intersect each other".

If one first regards the position where the gas flows 48a and 50a intersect, it can be seen that the light propagates through two gas flows having temperatures which are equal to the temperature of the ambient gas. Therefore a light ray passing through this position will not experience any optical path length difference as compared to light rays that do not pass through any of the gas flows 48a, 48b, 50a, 50b. Therefore this position is indicated with a 0.

At the position where the gas flows 48a and 50b intersect each other, the situation is different. Because the gas flow 50b has a higher temperature than the ambient gas, light passing through this position experiences an optical path length difference. This path length difference is a result of the different refractive indices of the gas flow 50b and the ambient gas.

Generally the refractive index of a gas decreases with increasing temperature, and therefore it is assumed in this example that the optical path length of light passing through this position is shorter than for light that does not pass through any gas flow. When the light passes through the gas flow 48a which has the same temperature as the ambient gas, no optical path length difference is added. Taken as a whole, light passing through both gas flows 48a and 50b will experience a shorter optical path length, and therefore this position has been indicated with a minus sign.

At the position where the gas flows 48b and 50a intersect, just the opposite occurs. Since the gas flow 48b has a lower temperature, it has a higher refractive index, and hence the optical path length for light passing through the two gas flows 48b and 50a is longer which is indicated with a plus sign.

At the position where the gas flows 48b and 50b intersect, a shorter optical path length in the gas flow 50b will add to a longer optical path length in the gas flow 48b. Here it is assumed that the temperatures of the gas flows 48b, 50b are set in such a manner that these two optical path lengths differences will compensate each other, i.e. they add to a zero net path length difference which is indicated in FIG. 5 by a 0.

A wavefront which propagates along the Z direction and passes through the four positions shown in FIG. 5 will therefore experience different path lengths depending on the position in the XY plane. This effect is used to correct a wavefront deformation that is produced by the optical elements contained in the projection objective 20.

Figure 6:
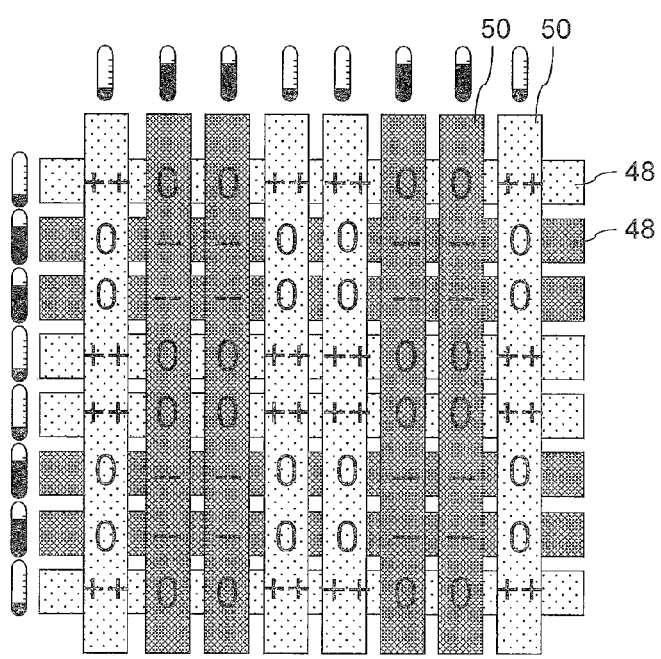
FIG. 6 is a schematic view similar to FIG. 5, but for 16 gas flows.

How this is accomplished will be explained in more detail with reference to FIGS. 6 to 8:

FIG. 6 is an illustration similar to FIG. 5, but showing a larger number of gas flows 48, 50. Adjacent gas flows 48 or 50 are spaced apart by small gaps. It should be appreciated that also these small gaps are only shown for the sake of simplicity. In real systems the gas flows will, although originally separated by a distance of at least twice the thickness of the channel walls 58, completely vanish because the gas flows 48, 50 tend to slightly broaden so that the gas flows produced by one outlet unit 30 or 34 will form a larger gas flow which is homogenous with regard to gas velocity and laminarity, but having a temperature profile which is determined by the temperature controller.

In FIG. 6 it is assumed that four of the eight gas flows emerging from each outlet unit 30, 34 have a higher temperature than the ambient gas and the other four gas flows have a lower temperature than the ambient gas. At positions where two gas flows 48, 50 having a higher temperature intersect, this will result in a double decrease of the optical path length which is indicated in FIG. 6 by a two minus signs. Similarly, a double increase of the optical path length is obtained where two gas flows 48, 50 having a lower temperature intersect. These positions are indicated by two plus signs. At those positions where a gas flow having a higher and a gas flow having a lower temperature intersect, the net effect on the optical path length difference is assumed to be zero, which is indicated again by a 0.

The signs ++, -- and 0 at the intersections thus indicate the impact on a wavefront which passes through the gas flows 48, 50 along the Z axis which is perpendicular to the plane of the drawing sheet.

Due to diffusion processes and thermal radiation, the temperature difference between adjacent gas flows 48, 50 emerging from the same outlet units 30, 34 will not be as sharp as illustrated in FIG. 6, but will be spatially blurred to some extent. As a result, the optical path length differences produced by the gas flows 48, 50 will be continuously distributed in the XY directions so that an optical path length distribution as it is schematically shown in FIG. 7 will be obtained. In FIG. 7 the solid, long and short dashed and dotted lines indicate positions where the path length difference is equal. The solid lines L1 and long dashed lines L2 indicate a positive path length difference, and the short dashed line L3 and dotted line L4 indicate a negative path length difference, wherein the path length difference decreases from L1 to L4. If a spherical wavefront passes through the gas flows 48, 50, the latter will produce a wavefront deformation which is similar to what is shown in FIG. 7. On the other hand, if a wavefront having a deformation which complements the pattern shown in FIG. 7 passes through the gas flows 48 and 50, the effect will be a complete correction of the wavefront deformation by the wavefront correction device 26.

Such a situation may occur, for example, if the illumination system 12 is operated with a quadrupole illumination setting. Such a quadrupole illumination setting is characterized by four poles P1 to P4 which are typically arranged with a fourfold symmetry in a pupil plane 74 of the illumination system 12, as this is illustrated in FIG. 8. This implies that also in subsequent pupil planes of the projection objective 20 a similar arrangement of poles can be observed. Particularly if the size of the poles P1 to P4 is small, high light energies occur on any lens which is located in or in close vicinity to a pupil plane in the projection objective 20. The high light intensities usually cause, as a result of partial absorption of projection light, a significant temperature rise in those portions of the lenses through which the projection light propagates. Within these portions the refractive index n changes as a result of the temperature change dT. Assuming that the material of the lens has the property of having a negative dn/dT, light passing through these portions of a lens will experience a reduced optical path length. The amount of the optical path length difference depends on the temperature of these portions and thus on the operating conditions of the projection exposure apparatus 10.

Figures 7, 8:
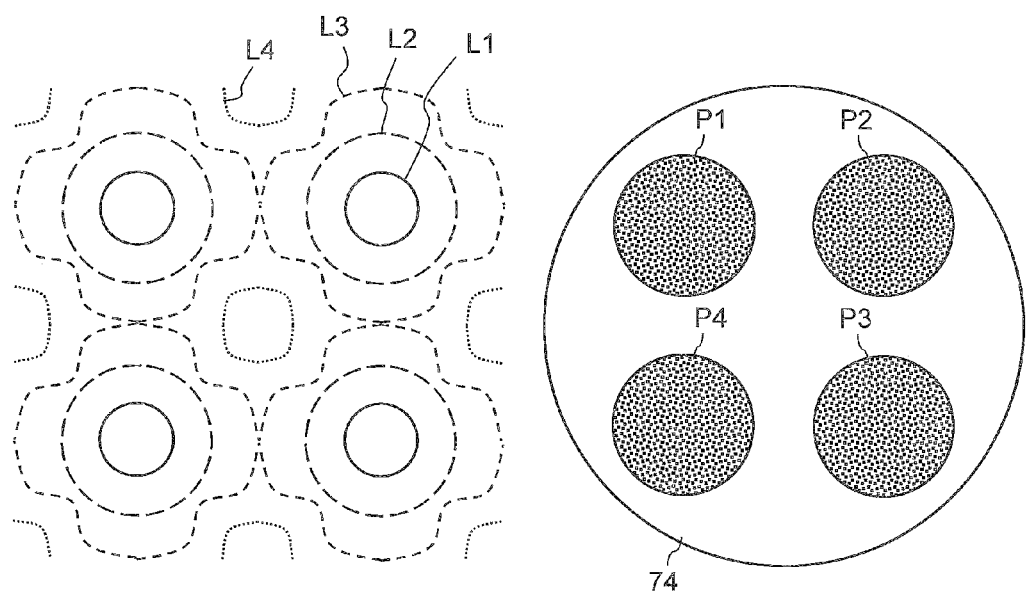
FIG. 7 is a schematic illustration of an exemplary temperature distribution obtained in a space through which projection light propagates.
FIG. 8 is an illustration showing an intensity distribution in the pupil surface of the projection objective for a quadrupole setting.

These optical path length differences could be compensated, at least to a significant extent, by the distribution of optical path length differences as shown in FIG. 7 which is produced by the wavefront correction device 26. The amounts of the optical path length differences produced by the wavefront correction device 26 can be easily adjusted by changing the temperatures of the fluid flows 48, 50 that are produced by the first and second outlet units 30 and 34, respectively. If the illumination setting is changed to a dipole setting, for example, the temperature distribution in the space through which the fluid flows 48, 50 propagate has to be changed accordingly. For example, the temperature distribution as illustrated in FIG. 9 could be produced which results in two symmetrical poles which are associated with a maximum path length difference, and two poles symmetrically arranged along an orthogonal direction in which the path length difference is negative.

Figure 9:
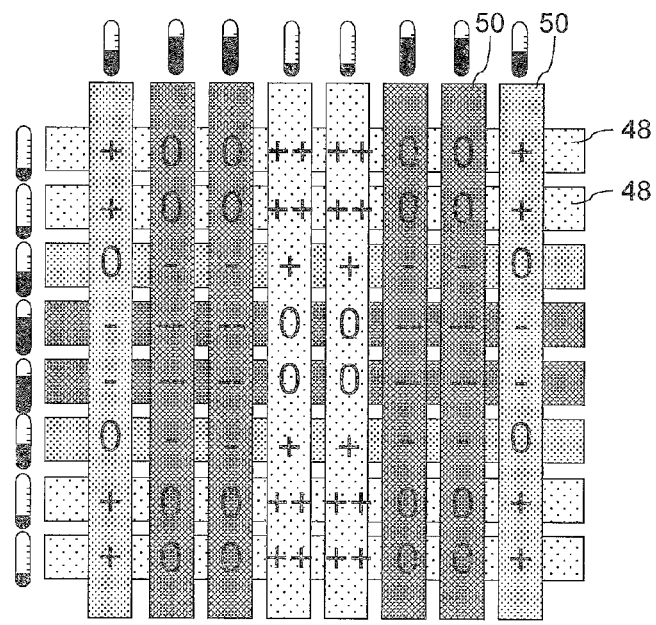
FIG. 9 is an illustration similar to FIG. 6, but with gas flows having other temperatures.

The temperature distributions illustrated in FIGS. 6 and 9 have in common that the fluid flows taken as a whole do not affect the net heat balance within the projection objective 20. This means that the amount of heat introduced by the gas flows which are heated above the ambient temperature completely compensates the amount of heat that is removed by those gas flows that have been cooled down from the ambient temperature. This can be easily checked by adding the −, −−, 0, + and ++ signs in FIGS. 6 to 9—in both cases the total sum equals zero.

The zero heat balance of the projection objective 20 has the advantage that no additional mechanism has to be provided to keep the temperature in the projection projective 20 constant. If one decides to control the temperature of the gas flows 48, 50 such that there is indeed an effect on the heat balance of the projection objective 20, the gas which leaves the first and second suction units 32, 36 via the outlet slits 54 should not get into the housing of the projection objective 20, but should be lead to the outside via a suitable channel.

II. Other Embodiments

1. Increased Spatial Resolution and Flexibility

In the above description of the first embodiment shown in FIGS. 1 to 9 it has been assumed that each pair of outlet apertures 44 arranged one behind the other along the Z direction produces gas flows 48, 50 having the same temperature. The grid-like temperature distributions shown in FIGS. 6 and 9 therefore have only two dimensions. However, if the first and second outlet units 30, 34 are controlled such that pairs of outlet apertures 44 arranged one behind the other along the Z direction may produce gas flows 48, 50 having different temperatures, a three dimensional temperature grid can be produced. For example, if the temperature distributions shown in FIGS. 6 and 9 are laid one above the other, this will result in a total temperature distribution that could not be obtained with only two independent layers of gas flows 48, 50.

Figure 10:
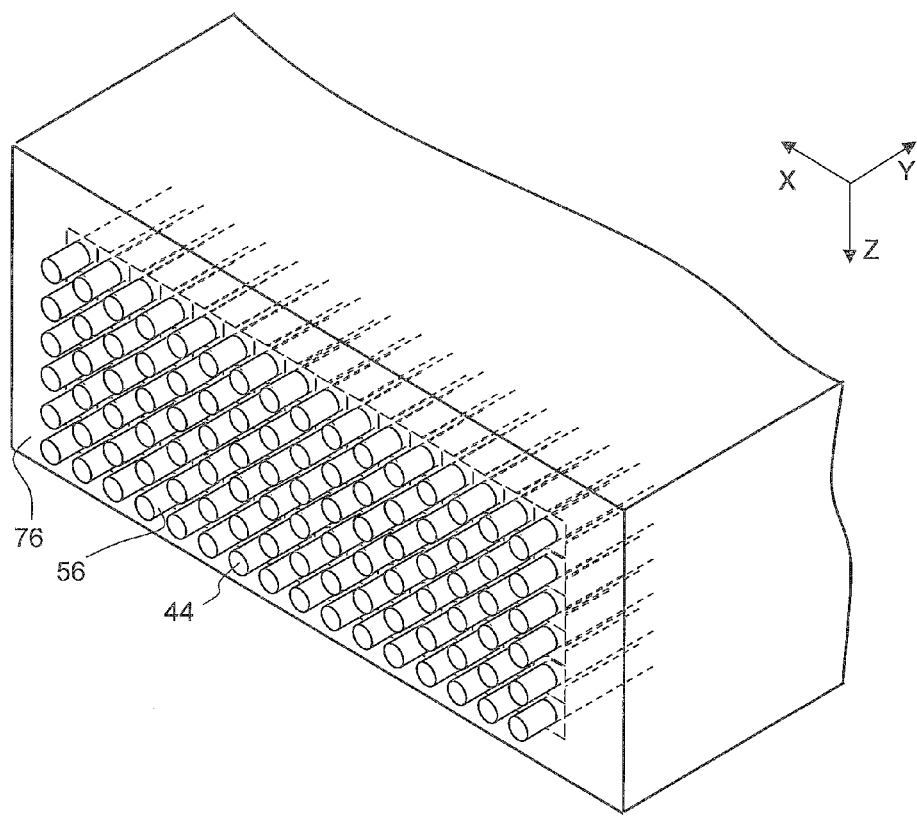
FIG. 10 is a schematic perspective view of a front end of an outlet unit according to another embodiment containing channels having a circular cross section.

Generally, the flexibility with regard to the possible wavefront corrections increases the larger the number of independent gas flows stacked one above the other along the Z direction is. FIG. 10 shows a front end of one of the outlet units 30, 34 according to another embodiment in which the outlet apertures 44 are arranged in a regular array in which six rows extending in XY planes and each including 16 outlet apertures 44 are stacked one above the other along the Z direction. The larger number of outlet apertures 44 in the XY planes increases the spatial resolution, and the larger number of rows stacked one above the other increases the flexibility with regard to the wavefront deformations that can be corrected with the help of the wavefront correction device 26.

In this embodiment the channels 56 that terminate in the outlet apertures 44 do not have a square cross section, but a circular cross section. This may be advantageous with regard to the laminarity of the gas flows 48, 50. The tubes defining the channels 58 can be heated or cooled individually and are received in a matrix formed by a thermal insulant 76.

Figure 11:
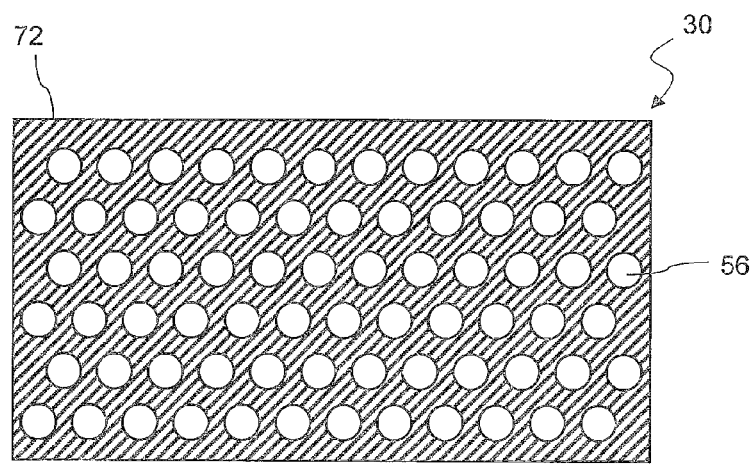
FIG. 11 is a cross section through an outlet unit according to a further embodiment in which the channels are laterally offset.

FIG. 11 shows a cross section through the first outlet unit 30 according to another embodiment. This embodiment differs from the embodiment shown in FIG. 10 mainly in that the channels 56, and therefore also the outlet apertures 44, are not arranged one behind the other along the Z direction. Instead, the rows of channels 56 are arranged in a staggered configuration. This still further increases the spatial resolution of the temperature distribution in the space through which the gas flows 48, 50 extend and through which also the projection light propagates.

2. Separating Plates

Depending on the temperature differences between the gas flows 48, 50, buoyancy forces may have the result that the gas flows 48, 50 will tend to slightly move up or down along the Z direction, or they will even lose their laminarity. Furthermore, it may be difficult to maintain the laminarity for those gas flows that are not completely surrounded by other parallel gas flows, but come into contact with the ambient gas or with a gas flow having a different propagation direction. In order to avoid these adverse effects, layers of gas flows may be separated by thin plane-parallel transparent plates or other solid optical elements.

Figure 12:
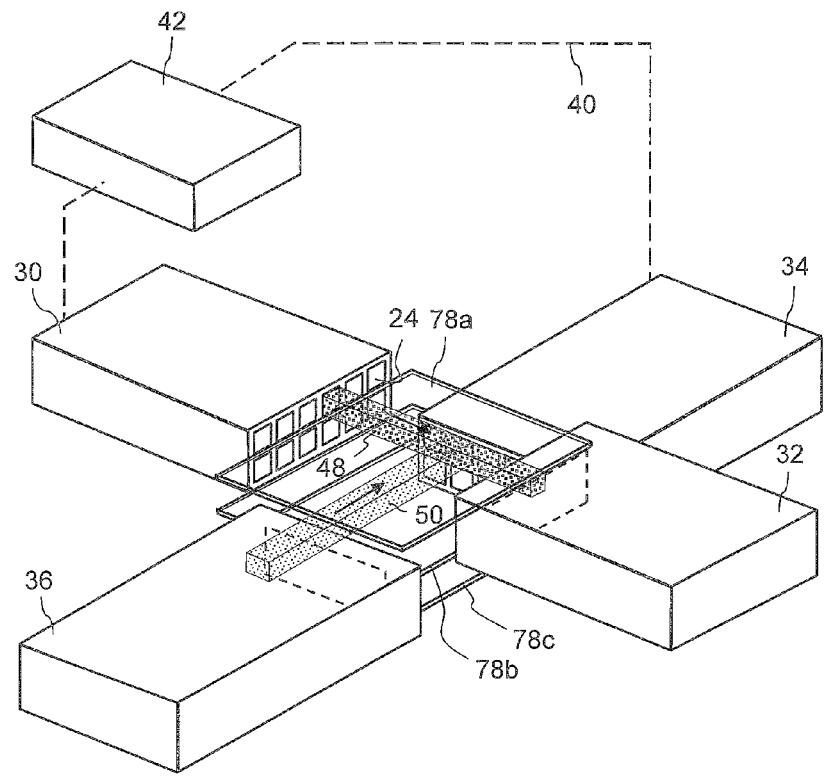
FIG. 12 is a schematic perspective view of a wavefront correction device according to a still further embodiment in which plates separate different layers of gas flows.

A wavefront correction device 26 including thin plates is illustrated in FIG. 12. Three plates 78a, 78b and 78c are arranged parallel to each other and between the four layers of gas flows 48, 50 that are produced by the first and second outlet units 30, 34. As can be seen in the simplified cross section shown in FIG. 13, each gas flow produced by one of the outlet apertures 44 is now confined along the Z direction by at least one plate 78a, 78b, 78c. Additional plates may also be provided above the first layer of gas flows and below the bottom layer of gas flows, as it is indicated in FIG. 13 by broken lines.

Each additional optical surface introduced by the plates 78a, 78b, 78c adds to the total light losses in the projection objective 20 due to reflection and absorption. Furthermore, the gas flows 48, 50 flowing along the plates 78a, 78b, 78c will, at least to some extent, change also the temperature of the plates 78a, 78b, 78c so that the plates 78a, 78b, 78c themselves may have a non-uniform effect on the wavefronts propagating therethrough. Therefore it will often be preferred to reduce the number of plates 78a, 78b, 78c as much as possible, or to completely dispense with such plates. On the other hand, it may be desirable to at least separate those gas flows 48, 50 that extend along different directions, because such gas flows will, if they come into contact, produce turbulences and will thus destroy the desired temperature distribution.

Figures 13, 14:
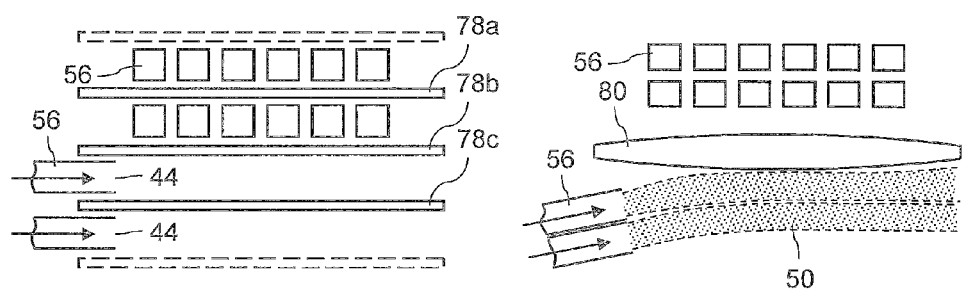
FIG. 13 is a schematic partial cross section through the wavefront correction device shown in FIG. 12.
FIG. 14 is a schematic partial cross section through a wavefront correction device according to another embodiment in which a thin lens separates gas flows.

FIG. 14 shows a schematic cross section similar to FIG. 13 in which a thin lens 80, which may be provided in the projection objective 20 anyway in the vicinity of the pupil surface, separates the gas flows extending along different directions. If the gas flows 50 below the lens 80 are those that have a higher temperature than the temperature of the ambient gas, they will slightly ascent due to the buoyancy forces, but are stopped by the lens 80 so that they cannot get in contact with the gas flows 48 extending above the lens 80 and having a lower temperature than the temperature of the ambient gas.

In the embodiment shown in FIG. 14 the channels 56 of the outlet unit 34 producing the lower gas flows 50 are inclined with respect to an XY plane such that the gas flows 50 extend (until they impinge on the lens 80) along a direction which is not perpendicular to the optical axis 28.

3. Liquid Flows

In the embodiments described so far the fluids that emerge from the outlet apertures 44 are gaseous. If there are plates or other optical elements that separate the layers of fluid flows from each other, as it is shown in FIGS. 12 and 13, it may also be envisaged to replace the gas flows by liquid flows.

Figure 15:
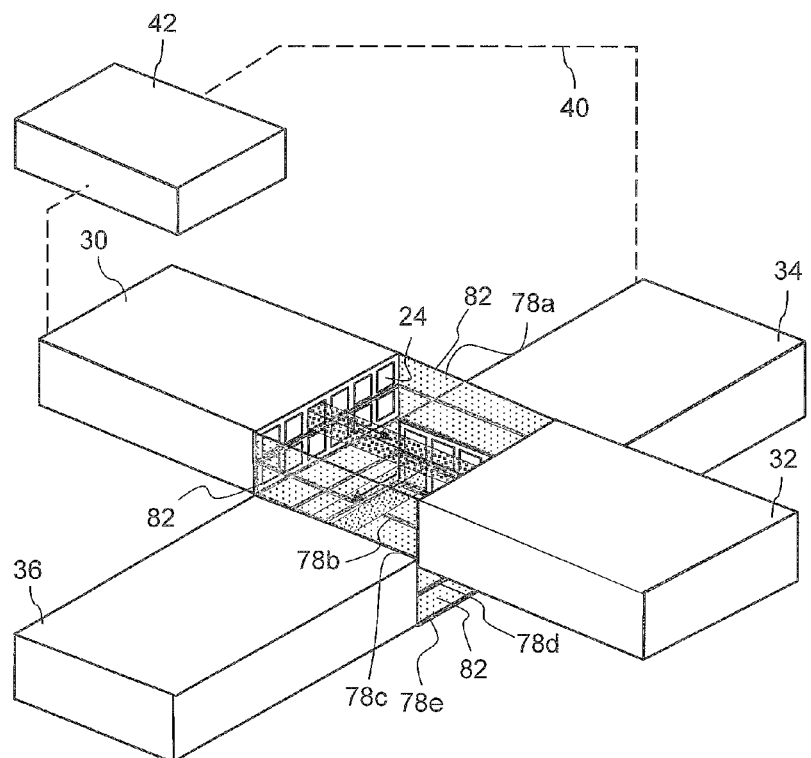
FIG. 15 is a schematic perspective view of a wavefront correction device according to an embodiment in which a liquid is used as a fluid.

FIG. 15 is a perspective view of an embodiment of a wavefront correction device 26 in which the first and second outlet units 30, 34 produce liquid flows that emerge from the outlet apertures 44. The liquid may be selected such that the refractive index of the liquid is at the ambient temperature at least substantially identical to the refractive index of plates 78a to 78e that confine, together with side walls 82, four volumes in which the liquid flows can extend through the space through which the projection light propagates. Very similar refractive indices of the liquid flows on the one hand and of the plates 78a to 78e on the other hand may help to ensure that refraction and reflection at the interfaces between the liquid flows 48, 50 on the one hand and the plates 78a to 78e on the other does not become too significant. Suitable liquids include water which has a high transmission coefficient for projection light having the typical operating wavelengths.

Figure 16:
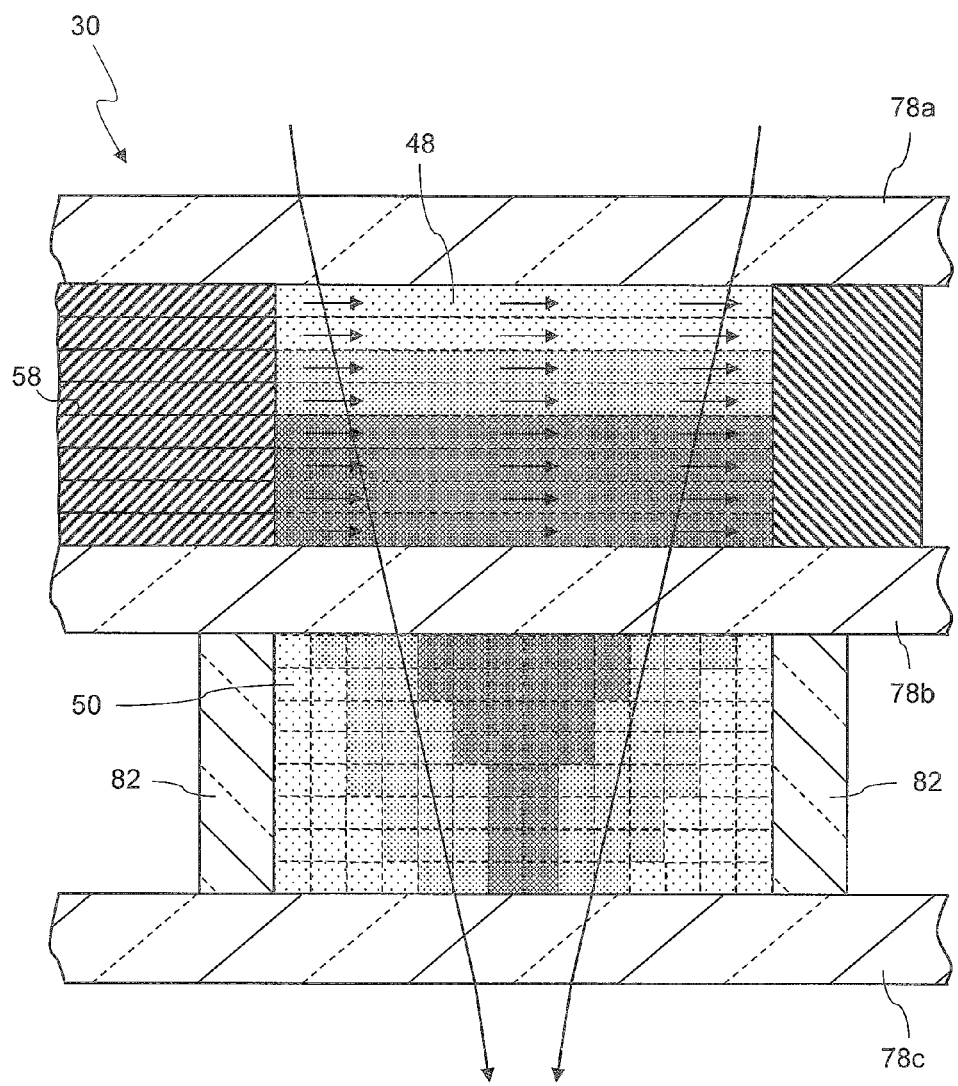
FIG. 16 is a cross section through a portion of a wavefront correction device according to another embodiment which also uses liquid flows.

FIG. 16 is a schematic cross section through a portion of a wavefront correction device 26 according to a further embodiment. Also in this embodiment liquid flows 48, 50 emerge from outlet apertures 44 provided in the first and second outlet units 30, 34. In contrast to the embodiment shown in FIG. 15, however, there is only one plate 78b that separates the liquid flows 48 extending along one direction from the liquid flows 50 extending along the orthogonal direction. In this embodiment the channel walls 58 are very thin so that an almost uniform liquid flow emerges from the array of outlet apertures 44. Similar to the gas flows of the first embodiment, the individual liquid flows 48, 50 having different temperatures combine to two larger laminar flows that have a temperature profile which is determined by the temperature controller. In FIG. 16 the different temperatures of the individual liquid flows 48, 50 are represented by different grey tones. The two larger combined flows confined by the plates 78a, 78b and 78c therefore form a kind of liquid lens having a refractive index profile that is determined by the temperatures of the liquid flows 48, 50 emerging from the outlet apertures 44.

4. More Fluid Flow Directions

In the embodiments described so far there are only two different directions of the fluid flows. With only two directions only a restrictive number of temperature distributions can be achieved. For being able to produce a larger number of different temperature distributions, more than two outlet units may be used that produce fluid flows along different directions.

Figure 17:
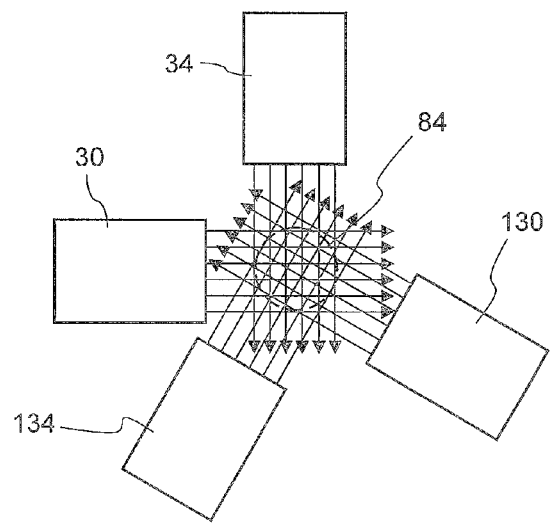
FIG. 17 is a top view along the optical axis on a wavefront correction device according to still another embodiment including four outlet units arranged at different Z positions along the optical axis and with different azimuth angles.

This is schematically shown in FIG. 17 which is a top view on the wavefront correction device 26 according to a still further embodiment. A circle 84 indicated with dotted lines represents the space through which projection light propagates and through which the fluid flows extend. In this embodiment two additional outlet units 130, 134 are arranged and displaced with respect to each other along the Z axis which is perpendicular to the plane of the drawing sheet. The outlets units 30, 34, 130 and 134 are arranged such that the fluid flows emerging from the outlet apertures have azimutal directions of 0°, 30°, 90° and 120°. Other angular orientations, for example with azimuth angles equal to 0°, 30°, 60° and 90°, may be envisaged, too. Furthermore, it is possible to add additional outlet units adding other directions. This will further increase the range of temperature distributions that can be produced by the wavefront correction device 26.

5. Wavefront Deformation Detection

Figure 18:
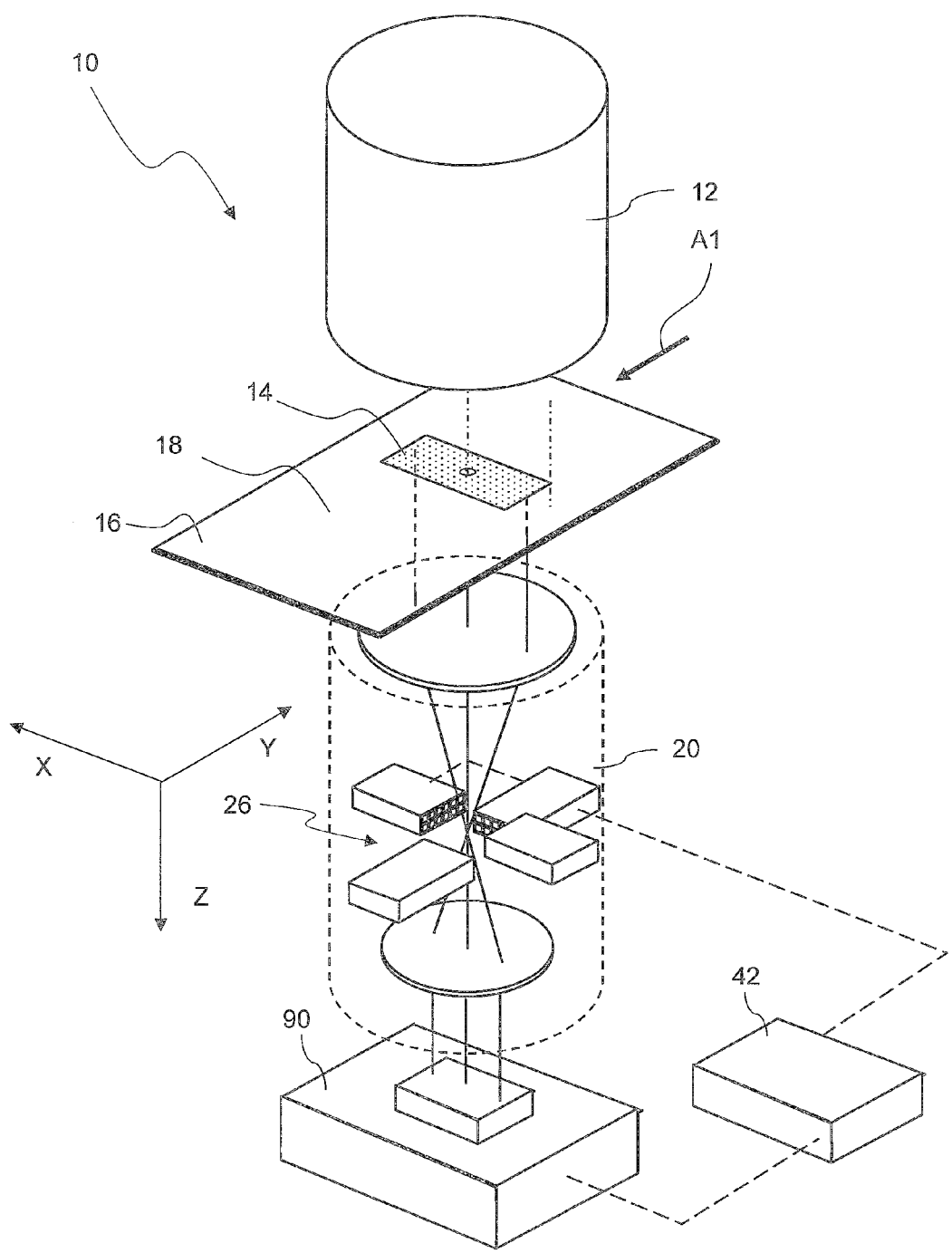
FIG. 18 is a perspective view of a microlithographic projection exposure apparatus similar to FIG. 1, but with a wavefront deformation detection system arranged in an image plane of the projection objective.

FIG. 18 is a schematic perspective view of a projection exposure apparatus 10 according to an embodiment in which the wavefront correction device 26 is connected to a wavefront deformation detection system 90. The latter is arranged in the projection exposure apparatus 10 at the position where usually the substrate 24 supporting the light sensitive layer 22 is arranged. The wavefront deformation detection system 90 enables an operator to perform a wavefront measurement for the projection objective 20 during times at which the normal projection operation is interrupted. Since such wavefront deformation detection systems 90 are known in the art as such, they will not be described in further detail.

The wavefront deformation detection system 90 is connected to the control unit 42 of the wavefront correction device 26. If the wavefront deformation detection system 90 detects a wavefront deformation which cannot be tolerated, the control unit 42 of the wavefront correction device 26 determines temperatures of the fluid flows such that the measured wavefront deformation will be substantially reduced in the manner that has been explained above with reference to FIGS. 5 to 9. The temperature controller then sets the temperatures of the fluid flows that have been determined by the control unit 42 so that finally the desired wavefront correction is achieved. Since the operating conditions within the projection objective 20 may change in the long term as well as in the short term, the wavefronts may be measured regularly in order to prevent a degradation of the imaging quality of the projection objective 20.

Alternatively or additionally to measurements of the wavefront deformations, the latter may be predicted using simulations or look-up tables that have been generated using measurements or simulations.

What is claimed is:

1. An optical system, comprising:
  a plurality of optical elements; and
  a wavefront correction device configured so that a gas flowing through the wavefront correction device emerges from the wavefront correction device via gas outlet apertures to provide gas flows which enter a space through which projection light propagates during operation of the optical system, the wavefront correction device comprising a temperature controller configured to set a temperature of each individual gas flow so that, taken as a whole, the gas flows do not affect a heat balance of the optical system,
  wherein the outlet apertures are configured so that none of the gas flows impinges on any of the optical elements, and the optical system is configured to be used in a microlithographic projection exposure apparatus.

2. The optical system of claim 1, wherein the outlet apertures are arranged so that at least some of the gas flows do not intersect each other.

3. The optical system of claim 1, wherein the outlet apertures are arranged so that at least some of the gas flows emerge from the outlet apertures at least substantially perpendicularly to an optical axis of the optical system.

4. The optical system of claim 1, wherein the outlet apertures are configured so that at least some of the gas flows impinge on a surface of an optical element to produce a laminar gas flow on the surface.

5. The optical system of claim 1, wherein the plurality of optical elements comprises a transparent optical element in a space such separating two adjacent gas flows.

6. The optical system of claim 1, further comprising a suction unit configured to remove the gas after the gas traverses the space.

7. The optical system of claim 1, wherein the wavefront correction device comprises:
  a gas supply unit; and
  a plurality of channels,
  wherein the channels are connected to the gas supply at one end, and the channels are connected to the outlet apertures at the other end.

8. The optical system of claim 7, wherein the temperature controller comprises heat dissipating members outside of channels walls defining the channels.

9. The optical system of claim 1, wherein the outlet apertures are arranged so that at least two gas flows are non-parallel.

10. The optical system of claim 1, wherein the outlet apertures are in planes that are spaced apart along an optical axis of the optical system.

11. The optical system of claim 10, wherein the gas flows have directions that are different for each plane.

12. A projection exposure apparatus, comprising
  an optical system according to claim 1; and
  a wavefront deformation detection system configured to detect a wavefront deformation,
  wherein:
    the wavefront deformation detection system is connected to the temperature controller;
    the temperature controller is configured to control the temperature of the gas flows depending on the wavefront deformation detected by the wavefront deformation detection system; and
    the projection exposure apparatus is a microlithographic projection exposure apparatus.

13. An optical system, comprising:
  a plurality of optical elements; and
  a wavefront correction device configured so that a fluid flowing through the wavefront correction device emerges from the wavefront correction device via fluid outlet apertures to provide fluid flows which enter a space through which projection light propagates during operation of the optical system, the wavefront correction device comprising a temperature controller configured to set a temperature of each individual fluid flow,
  wherein the outlet apertures are configured so that none of the fluid flows impinges on any of the optical elements, and the optical system is configured to be used in a microlithographic projection exposure apparatus.

14. The optical system of claim 13, wherein the outlet apertures are arranged so that at least some of the fluid flows do not intersect each other.

15. The optical system of claim 13, wherein the outlet apertures are arranged so that at least some of the fluid flows emerge from the outlet apertures at least substantially perpendicularly to an optical axis of the optical system.

16. The optical system of claim 13, further comprising a transparent optical element in a space such separating two adjacent fluid flows.

17. The optical system of claim 13, further comprising a suction unit configured to remove the fluid after the fluid traverses the space.

18. The optical system of claim 13, wherein the wavefront correction device comprises:
  a fluid supply unit; and
  a plurality of channels,
  wherein the channels are connected to the fluid supply at one end, and the channels are connected to the outlet apertures at the other end.

19. The optical system of claim 18, wherein the temperature controller comprises heat dissipating members outside of channels walls defining the channels.

20. The optical system of claim 13, wherein the outlet apertures are arranged so that at least two fluid flows are non-parallel.

21. The optical system of claim 13, wherein the outlet apertures are in planes that are spaced apart along an optical axis of the optical system.

22. The optical system of claim 21, wherein the fluid flows have directions that are different for each plane.

23. The optical system of claim 13, wherein the fluid is a liquid.

24. A projection exposure apparatus, comprising
  an optical system according to claim 13; and
  a wavefront deformation detection system configured to detect a wavefront deformation, wherein:
the wavefront deformation detection system is connected to the temperature controller;
the temperature controller is configured to control the temperature of the fluid flows depending on the wavefront deformation detected by the wavefront deformation detection system; and
the projection exposure apparatus is a microlithographic projection exposure apparatus.

25. A method, comprising:
guiding a plurality of gas flows through a space in an optical system of a microlithographic projection exposure apparatus while light propagates through the space; and
reducing a wavefront deformation by individually controlling the temperatures of the gas flows so that, taken as a whole, the gas flows do not affect a heat balance of the optical system,
wherein the microlithographic projection exposure apparatus comprises a plurality of optical elements, and none of the optical elements is between the gas flows.

26. The optical system of claim 1, wherein the system is configured so that, during operation of the temperature controller, none of the optical elements is between the gas flows.

27. The optical system of claim 13, wherein the system is configured so that, during operation of the temperature controller, none of the optical elements is between the gas flows.

28. An optical system, comprising:
a plurality of optical elements; and
a wavefront correction device configured so that a gas flowing through the wavefront correction device emerges from the wavefront correction device via gas outlet apertures to provide gas flows which enter a space through which projection light propagates during operation of the optical system, the wavefront correction device comprising a temperature controller configured to set a temperature of each individual gas flow so that, taken as a whole, the gas flows do not affect a heat balance of the optical system,
wherein:
the system is configured so that, during operation of the temperature controller, none of the optical elements is between the gas flows; and
the optical system is configured to be used in a microlithographic projection exposure apparatus.

* * * * *